Dec. 13, 1966 B. E. SEAR 3,292,009
STORED CHARGE RESET FOR LOGIC CIRCUITS
Filed Dec. 20, 1963

INVENTOR
BRIAN ELLIOTT SEAR
BY G. Donald Weber, Jr.
AGENT

United States Patent Office 3,292,009
Patented Dec. 13, 1966

3,292,009

STORED CHARGE RESET FOR LOGIC CIRCUITS

Brian E. Sear, Baltimore, Md., assignor to Sperry Rand Corporation, New York, N.Y., a corporation of Delaware Filed Dec. 20, 1963, Ser. No. 332,184
6 Claims. (Cl. 307—88.5)

This invention relates to logic circuits. In particular, the invention relates to logic circuits utilizing tunnel diodes (as the switchable elements thereof) and semiconductor elements exihibiting recombination or charge storage characteristics for controlling the application of signals to reset the tunnel diodes to one voltage condition.

In tunnel diode circuits which are used in the art, it is often required (or at least desired) that bistable operation be provided. Thus, the bias current (and load-line arrangement) permits two stable operating conditions for the tunnel diode. Therefore, in order to obtain a useful and meaningful output from the tunnel diode circuit, it is necessary that the tunnel diode be resettable, to the low voltage operating condition for example. This resetting operation is usually performed by merely applying a properly poled signal to a rectifier diode connected directly to the tunnel diode such that current (or charge) is removed from the tunnel diode whereby the current therethrough or voltage thereacross is sufficiently reduced. However, this operation has disadvantages in that the applied signal must be carefully controlled as to the duration, the duration-amplitude combination, the shape, etc. The instant invention obviates this disadvantage.

In the instant invention, a stored charge diode or recombination diode is inserted between the tunnel diode and the rectifier diode. In addition, an additional bias source is supplied to provided current for the stored charge diode. The stored charge diode (sometimes called a "snap-off" diode or a storage diode) provides a direct control over the charge-current content of the reset signal. That is, only a certain relatively fixed amount of charge can be stored in the lattice structure of the stored charge or storage diode. This stored charge is defined, in this case, as being greater than the amount of charge required to be removed from the tunnel diode to cause it to be reset while being less than the amount of current which would destroy the tunnel diode. When the stored charge is removed from the storage diode, the storage diode becomes open circuited regardless of the condition of the signal applied to the rectifier diode.

Thus, it will be seen that one object of this invention is to provide a logic circuit using tunnel diodes and stored charge reset thereof.

Another object of this invention is to provide a tunnel diode logic circuit with a stored charge reset network.

Another object of this invention is to provide a novel reset network for the tunnel diode in a high speed switching network.

Another object of this invention is to provide a tunnel diode circuit wherein an improved fan-out characteristic may be achieved.

Another object of this invention is to provide a tunnel diode logic circuit having a level output between the clock pulses of a particular phase in order to provide a maximum flexibility of system logic.

Another object of this invention is to provide a tunnel diode logic circuit wherein the delay requirements between stages is reduced.

These and other objects and advantages of this invention will become more readily apparent subsequent to a reading of the following description in conjunction with the attached drawings, in which.

Figure 1:
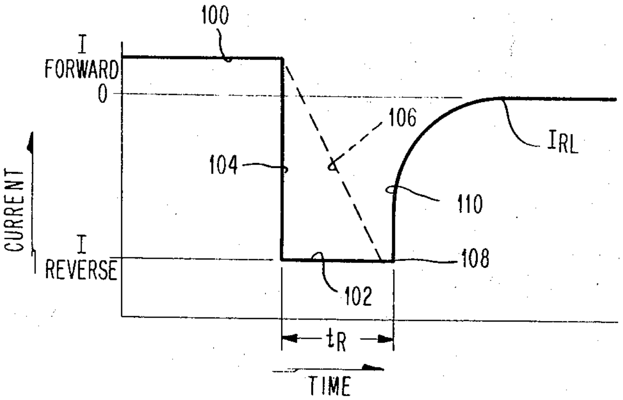
FIGURE 1 is a graphical representation of the recombination characteristic of a typical rectifier diode exhibiting recombination properties.

Referring now to FIGURE 1, there is shown a typical characteristic of a semiconductor diode exhibiting recombination properties as described in the November, 1954 issue of Radio Electronics at pages 94 and 95. This characteristic is shown as a function of current versus time. The heavy continuous line is representative of the idealized characteristic. The dashed line is representative of a more realistically obtainable characteristic. It is to be understood of course, that certain noise and ringing effects may also occur but are eliminated from the drawing for simplicity. In particular, the line 100 is representative of the current which is passed by the diode when the diode is biased in the forward direction, i.e., with a positive potential applied to the anode of the diode relative to its cathode. When the potential applied to the anode of the diode is switched to a negative potential relative to its cathode, the current through the diode immediately switches, in the ideal case, from the forward current, $I_F$, to the reverse current, $I_R$, designated by line portion 102. This reverse current is provided by the fact that there is a recombination of the stored charge in the semiconductor material of the diode. That is, the reverse current is created by the recombination of the electrons and holes in the material of the diode either as they drift to the recombined condition, or, in the alternative, if the diode is properly reverse biased, the subatomic charged particles may be actually swept through the diode structure to the proper position. Regardless of the manner in which the recombination takes place, a reverse current is exhibited by the diode; and power gain can be achieved in a circuit utilizing this phenomenon. The larger the reverse current, the shorter the recombination time $t_R$.

The vertical line portion 104 suggests that the switching of the diode can be done instantaneously. This suggestion is of course, only for the idealized case. Practically, the transition characteristic between the forward and reverse currents is more closely akin to the line portion 106 (shown dashed). Nevertheless, whenever a recombination diode has been rendered conducting in the forward direction, a certain reverse current is exhibited by the diode when the potentials at the electrodes thereof are reversed. When the minority charge carriers have been substantially completely recombined, (as for example at the point 108) a small current continues to flow through the diode for a short period of time. This current, represented by the arcuate line portion 110, is termed the reverse leakage current $I_{RL}$. The magnitude of thus current is indicated by an exponential and asymptotic curve (line portion 110) and approaches a very small value. The magnitude of the current is limited by the impedance of the reverse biased diode.

Figure 2:
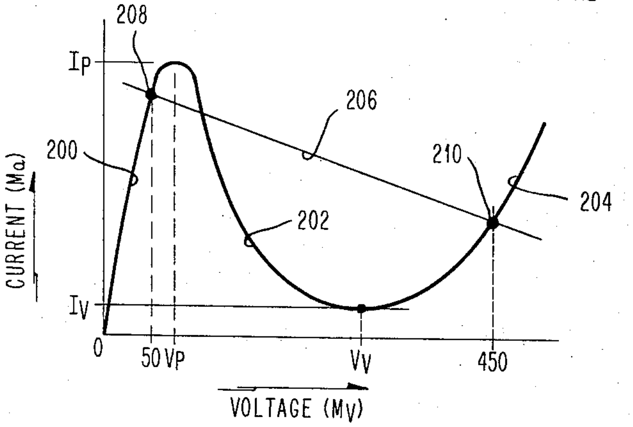
FIGURE 2 is a graphical representation of a V–I characteristic of a typical tunnel diode.

Referring now to FIGURE 2, there is shown graphically a typical tunnel diode V–I characteristic. The low voltage or peak voltage state is represented by line portion 200 (between zero and $V_P$). The unstable or negative resistance region is represented by line portion 202 (between $V_P$ and $V_V$). The high voltage or forward voltage state of the tunnel diode is represented by line portion 204 (to the right of $V_V$). The load line 206 is representative of a steady state load line which intersects the V–I characteristic of the tunnel diode. Load line 206 intersects the tunnel diode characteristic at point 208 in the low vlotage state and at point 210 in the high voltage state of the tunnel diode operation. As shown in FIGURES 1 and/or 2, the idealized characteristics are illustrative only and not to be limitative of the operation of the circuit.

Figure 3:
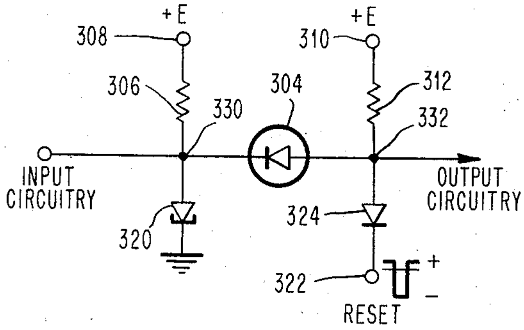
FIGURE 3 is a schematic drawing of one embodiment of the invention.

Referring now to FIGURE 3, there is shown a schematic drawing of one embodiment of this invention. Input circuitry of any type including a tunnel diode may be connected to the circuit via input means as for example, coupling resistors or the like. For simplicity, the input circuitry is not shown in detail. However, it is to be understood that the input circuitry may be representative of a single input device or a plurality of separate and individual input circuits, each of which is capable of supplying input signals. The number of input sources is not fixed but may be varied to include the number of sources which is desired. A recombination rectifier diode 304 which may be a Clevite 1N270, has the anode thereof connected to common junction 332 and its cathode connected to common junction 330. Recombination diode 304 is the diode which provides the reset coupling control as will become apparent with the descrption of the operation of the circuit. Resistor 306 (1000 ohms for example) has one terminal thereof connected to common terminal 330 and another terminal thereof connected to potential source 308. Potential source 308 provides a substantially constant potential of approximately +15 volts. The anode of tunnel diode 320 is connected to common junction 330 and the cathode thereof is connected to a suitable reference potential source, for example ground. A typical tunnel diode is the RCA 1N3129 type. Tunnel diode 320 is preferably biased for bistable operation by potential source 308 and resistor 306 which is connected thereto to form a substantially constant current source. Connected to the anode of recombination diode 304 is the anode of rectifier diode 324. Diode 324 may be any type of high speed silicon rectifier diode, for example HD 5000. The cathode of diode 324 is connected to reset clock 322. The reset clock 322 is, in this embodiment, adapted to provide a negative going signal with respect to ground thereby producing a current signal which is sufficient to reset the tunnel diode 320 from the forward voltage condition to the peak voltage condition. This current signal has few requirements with regard to shape, duration and the like, as will be seen subsequently. Typically, however, the reset signal has a base line potential which is slightly positive such that diode 324 is normally nonconductive and a peak negative magnitude which is sufficiently negative to assure the switching of tunnel diode 320. The anode of rectifier diode 324 is connected to common junction 332. A substantially constant current source comprised of potential source 310 (about +2 volts) and resistor 312 (about 2000 ohms) is connected to common junction 332. Thus, a current of about 1 milliampere is selectively supplied to recombination diode 304 in the forward direction. Also connected to common junction 332 is external output circuitry. As in the case of the input circuitry, the output circuitry may be representative of a single device utilizing the output signal or, on the contrary, the output circuitry may be representative of a plurality of output circuits. The number of output loads to be driven by tunnel diode 320 is limited by the practical output available from the tunnel diode.

The operation of the circuit shown in FIGURE 3 is relatively straightforward. The constant current source which comprises source 308 and resistor 306, supplies a substantially constant current to tunnel diode 320. This current is sufficient to bias tunnel diode 320 to the bistable operating mode. When in the low voltage operating condition (operating point 208 in FIGURE 2), the potential at the anode of tunnel diode 320 is on the order of +40 to +50 millivolts. On the other hand, when the tunnel diode is in the high voltage operating region (operating point 210 in FIGURE 2), the potential at the anode thereof is on the order of +450 millivolts. The potential at the anode of the tunnel diode is also applied to the cathode of recombination diode 304. The potential at the anode of diode 304 is dependent upon the signal supplied by reset signal source 322. When the signal supplied by reset source 322 is the high level, or slightly positive signal for example, diode 324 is reverse biased. That is, the potential applied at common junction 332 is insufficient to overcome the inherent voltage drop which exists across diode 324 in conjunction with the potential applied at the cathode thereof. Therefore, the potential at junction 332 is a positive value. Since the forward voltage drop across diode 304 is less than the forward voltage drop across diode 324, diode 304 is forward biased regardless of the anode potential of the tunnel diode. Therefore, a current path exists from source 310 via resistor 312, diode 304 and tunnel diode 320 to ground. This current is, of course, a forward current through diode 304. Typically, such a forward current causes the storage of charge at the PN junction in the storage diode. Of course, the amount of charge stored will vary as a function of the forward current through the diode. The charge stored in storage diode 304 may be dissipated or cleaned up by the long time process of drift current at the PN junction or by sweeping of charge out of the diode by the application of a large reverse current.

When the reset signal supplied by source 322 goes negative, to the magnitude of approximately −3 volts or more, rectifier diode 324 is forward biased. The reset signal supplied by source 322 is such that a very large current is drawn through rectifier diode 324. If storage diode 304 has previously carried forward current and had chrage stored therein, the reverse impedance of tunnel diode 320 is also relatively small. Consequently, when current is drawn through rectifier diode 324 in response to the application of the reset signal by source 322, a large reverse current exists in diode 304. This reverse current may be considered to be drawn through tunnel diode 320 (or, in the alternative, from the bias source) such that the current through tunnel diode 320 is reduced below the valley current $I_V$ (see FIGURE 2). When the value of current through tunnel diode 320 falls below the valley current, $I_V$, the tunnel diode is switched from the high voltage to the low voltage operating condition.

Thus, it is shown that the limitations on the configuration, duration and the like of the reset clock signal have been greatly reduced. That is, the reset signal need only be sufficiently large in magnitude and duration to assure that a current signal large enough to switch the tunnel diode from the high voltage to the low voltage operating regions wil be applied to the tunnel diode via a storage diode. This switching may occur even if the reset signal is a spike-like signal having a very large magnitude such that the charge stored in the storage diode is removed in an extremely short time period. Since the charge movement in the storage diode defines the curent flow therethrough, a rapid charge removal produces a large current pulse. Thus, a large magnitude reset signal will rapidly remove the charge from the storage diode such that the storage diode is cut off and the tunnel diode isolated from the reset signal source before the tunnel diode can be destroyed thereby. On the other hand, if the reset signal is a relatively slow or long-enduring type of signal, the circuit is still effective so long as the reset signal is sufficiently large to produce a switching current in the tunnel diode. In fact, so long as the tunnel diode is switched somewhat prior to the cleaning up of the stored charge in the storage diode and the storage diode is cleaned up prior to the application of input signals by the input circuitry, the reset signal configuration is immaterial.

Another advantage that is obtained from this type of device is that regardless of the slowness or length of duration of the reset signal, the cleaned up storage diode effectively isolates the tunnel diode from the reset source. Thus, immediately after the switching of the tunnel diode, the input circuitry has access to the tunnel diode for operations therewith. In the absence of the storage diode, the application of input signals via the input circuitry is limited to those times when the reset signal has already terminated. Therefore, in addition to providing desirable isolation between stages of a circuit, the stored charge reset circuit permits faster logic operation of the tunnel diode circuitry because of the isolation thereof from the reset signal source immediately upon the recombinational switching of the storage diode.

Figure 4:
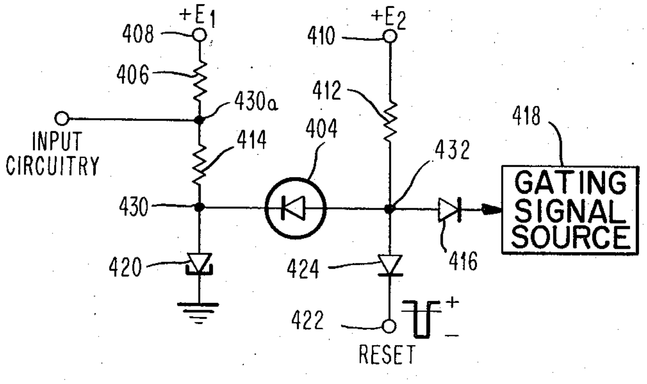
FIGURE 4 is a schematic drawing of another embodiment of the invention.

Referring now to FIGURE 4, there is shown a schematic diagram of another embodiment of this invention. In FIGURE 4, components which are similar to those shown in FIGURE 3 bear reference numerals having the last two digits thereof similar to the last two digits of the reference numerals affixed to the counterpart elements in FIGURE 3. Thus, it is seen that a level shifting resistor 414 is connected between the common junction 430 and one terminal of resistor 406 which is a portion of the constant current supplying source which includes potential source 408. This resistor provides the advantage of improved operation over the circuit shown in FIGURE 3 in that the input circuitry, in a tunnel diode for example, will not inadvertently be reset or switched by the application of a reset signal via storage diode 404. That is, the potential at the common junction 430*a* is necessarily slightly higher than the potential at common junction 430. Therefore, a certain direct coupled isolation exists between the reset storage diode 404 and the input circuitry. The constant current source comprising potential source 410 and resistor 412 is connected to the common junction 432. Common junction 432 is connected to the anode of storage diode 404 and the anode of high speed rectifier diode 424. The cathode of the rectifier diode 424 is connected to the reset pulse source 422 which is similar to reset pulse source 322 described and shown in FIGURE 3. Also connected to the common junction 432 is the anode of coupling diode 416. The cathode of coupling diode 416, which may be a high speed rectifier diode for example, is connected to a gating signal source 418. The gating signal source may be any conventional source of pulses which may be selectively applied to the cathode of coupling diode 416. The gating signal source supplies a signal which when in the high level is sufficiently positive to reverse bias the coupling diode 416 such that this diode is cut off and nonconductive. In the alternative, the signal source 418 supplies either a negative or substantially ground potential signal which is sufficiently low to selectively enable or forward bias diode 416 such that forward current therethrough may exist.

From the operation of the circuit shown in FIGURE 4, tunnel diode 420 is biased for bistable operation by the constant current source comprising potential source 408 and resistor 406. The constant current is supplied to the tunnel diode via resistor 414. The potential at the anode of tunnel diode 420 is such (+50 or +450 millivolts, for example) that forward current may exist through storage diode 404 regardless of the state of the operating condition of the tunnel diode such that charge may be selectively stored in storage diode 404. However, in the embodiment shown in FIGURE 4 the application of a low level signal to the cathode of diode 416 by gating signal source 418 causes diode 416 to be highly forward conductive. Under these circumstances, the forward impedance of diode 416 is significantly less than the forward impedance of storage diode 404 whereby the forward current, $I_F$, flows through the coupling diode 416 instead of through storage diode 404. Under these circumstances, no charge is stored in the storage diode. Therefore, with the application of a negative-going reset signal source from source 422, it is impossible to produce reverse current through storage diode 404 inasmuch as no charge was stored therein.

When gating signal source 418 supplies a high level signal, coupling diode 416 is reverse biased and cannot conduct current therethrough. Therefore, the current supplied by the substantially constant current source comprising potential source 410 and resistor 412 supplies forward current through storage diode 404 and tunnel diode 420 to ground. This forward current produces charge storage in storage diode 404. Thus, with the application of a negative-going reset signal by source 422, a reverse current through storage diode 404 can be achieved. This reverse current is defined to be sufficient to cause tunnel diode 420 to be reset from the high voltage to the low voltage operating condition.

Thus, it becomes imminently clear that the advantages enumerated supra with regard to the operation of the reset signal in conjunction with a storage diode may be utilized in the circuit embodiment shown in FIGURE 4. In addition, the provision of the gating signal source 418 permits the selective application or nonapplication of forward current to the storage diode 404 whereby charge may be stored therein such that the reset signal supplied by source 422 may be effective. This type of operation may be used to produce NRZ operation of the circuit.

Thus, the objects of this invention have been shown to be achieved by a relatively simple circuit utilizing stored charge techniques. It is to be understood of course, that the specific embodiments shown are not meant to be limitative of the invention. From the foregoing description, it will be understood that various changes may be made in the form, construction and arrangement of the parts, without departing from the scope of the invention, the form hereinbefore described being merely a preferred embodiment.

The embodiments of the invention in which an exclusive property or privilege is claimed are defined as follows:

1. A circuit comprising, input circuit means, a circuit element exhibiting two stable operating conditions, said circuit element connected to said input circuit means, a charge storage device selectively exhibiting bilateral conduction wherein one type of conduction is a direct function of the other type of conduction, a current source, said charge storage device being connected between said current source and said circuit element such that said other type of conduction normally exists from said current source to said circuit element via said charge storage device, a pulse supplying source connected to said charge storage device such that in response to the application of a pulse by said pulse source said one type of conduction exists from said circuit element to said pulse source via said charge storage device until the charge stored in said charge storage device has been dissipated whereupon said charge storage device becomes a substantially open circuit and said circuit element is isolated from said pulse source.

2. A condition controlling circuit comprising, input circuit means, a circuit element exhibiting two stable operating conditions, said circuit element connected to said input circuit means, a charge storage device selectively exhibiting bilateral conduction wherein one type of conduction is a direct function of the other type of conduction, a current source, said charge storage device being connected between said current source and said circuit element such that said other type of conduction exists from said current source to said circuit element via said charge storage device, a signal supplying source, rectifier means connected between said signal supplying source and said charge storage device such that the application of a signal by said signal supplying source produces said one type of conduction from said circuit element to said pulse source via said charge storage device until the charge stored in said charge storage device has been dissipated whereupon said charge storage device becomes a substantially open circuit and said circuit element is isolated from said pulse source regardless of the duration of said signal.

3. A condition controlling circuit comprising, input circuit means, a tunnel diode exhibiting two stable operating conditions, said tunnel diode having the anode thereof connected to said input circuit means, a charge storage diode selectively exhibiting forward and reverse current conduction wherein the reverse conduction is a direct function of the forward conduction, a substantially constant current source, said charge storage diode being connected between said current source and said tunnel diode such that said forward conduction normally exists from said current source to said tunnel diode via said charge storage device regardless of the condition of said tunnel diode, a pulse supplying source, and a rectifier diode connected between said pulse supplying source and said charge storage diode such that said reverse conduction exists from said tunnel diode to said pulse source via said charge storage diode until the charge stored in said charge storage diode has been dissipated whereupon said charge storage diode becomes a substantially open circuit and said tunnel diode is isolated from said pulse source, said reverse current being of sufficient magnitude to assure that said tunnel diode operates in a predetermined one of said two stable operating conditions after the application thereof.

4. The condition controlling circuit of claim 3 including a level shifting impedance, said level shifting impedance providing the connection between said input circuit means and said tunnel diode.

5. A condition controlling circuit comprising, input circuit means, a tunnel diode exhibiting two stable operating conditions, said tunnel diode having the anode thereof connected to said input circuit means, a charge storage diode selectively exhibiting forward and reverse current conduction wherein the reverse conduction is a direct function of the forward conduction, a substantially constant current source, said charge storage diode being connected between said current source and said tunnel diode, gating means connected to said current source and said charge storage diode, said gating means alternatively assuming one of two different operating conditions, the first of said operating conditions being such that said forward conduction exists from said current source to said tunnel diode via said charge storage device regardless of the condition of said tunnel diode, the second of said operating conditions being such that conduction exists from said current source to said gating means and no conduction exists in said storage diode, a pulse supplying source, and means connected between said pulse supplying source and said charge storage diode such that said reverse conduction exists from said tunnel diode to said pulse source via said charge storage diode until the charge stored in said charge storage diode only by forward conduction therethrough has been dissipated whereupon said charge storage diode becomes a substantially open circuit and said tunnel diode is isolated from said pulse source, said reverse current being of sufficient magnitude to assure that said tunnel diode operates in a predetermined one of said two stable operating conditions, said tunnel diode being isolated from said pulse source in the absence of forward conduction therethrough whereby the tunnel diode may operate in either of its two stable operating conditions.

6. A condition controlling circuit comprising, input circuit means, a tunnel diode exhibiting high and low voltage stable operating conditions, said tunnel diode having the anode thereof connected to said input circuit means, a charge storage diode having the cathode thereof connected to said anode of said tunnel diode and selectively exhibiting forward and reverse current conduction wherein the reverse conduction is a direct function of the forward conduction, a substantially constant current source connected to the anode of said charge storage diode, nonlinear impedance means connected to the anode of said storage diode and exhibiting high and low current conducting conditions, said high current conducting condition providing current conduction from said current source through said non-linear impedance means, said low current conducting condition providing forward conduction from said current source to said tunnel diode via said charge storage device regardless of the condition of said tunnel diode thereby storing charge in said storage diode, a pulse supplying source, and unilateral conducting means connected between said pulse supplying source said charge storage diode such that said reverse conduction exists from said tunnel diode to said pulse source via said charge diode only when charge has been previously stored therein and only until the charge stored in said charge storage diode has been dissipated whereupon said charge storage device becomes a substantially open circuit and said tunnel diode is isolated from said pulse source, said reverse current being of sufficient magnitude to assure that said tunnel diode operates in said low voltage stable operating condition.

No references cited.

ARTHUR GAUSS, *Primary Examiner.*

R. H. EPSTEIN, *Assistant Examiner.*